United States Patent
Khlat et al.

(10) Patent No.: US 12,199,577 B2
(45) Date of Patent: *Jan. 14, 2025

(54) ENVELOPE TRACKING VOLTAGE CORRECTION IN A TRANSMISSION CIRCUIT

(71) Applicant: Qorvo US, Inc., Greensboro, NC (US)

(72) Inventors: Nadim Khlat, Cugnaux (FR); James M. Retz, Cedar Rapids, IA (US)

(73) Assignee: Qorvo US, Inc., Greensboro, NC (US)

( * ) Notice: Subject to any disclaimer, the term of this patent is extended or adjusted under 35 U.S.C. 154(b) by 231 days.

This patent is subject to a terminal disclaimer.

(21) Appl. No.: 17/700,826

(22) Filed: Mar. 22, 2022

(65) Prior Publication Data

US 2022/0407478 A1 Dec. 22, 2022

Related U.S. Application Data

(60) Provisional application No. 63/245,145, filed on Sep. 16, 2021, provisional application No. 63/245,156, (Continued)

(51) Int. Cl.
*H03F 3/24* (2006.01)
*H03F 1/02* (2006.01)
(Continued)

(52) U.S. Cl.
CPC ........... *H03F 3/245* (2013.01); *H03F 1/0227* (2013.01); *H03F 1/3241* (2013.01); *H03F 3/195* (2013.01);
(Continued)

(58) Field of Classification Search
CPC ............... H03F 3/245; H03F 2200/102; H03F 2200/451; H03F 1/0227; H03F 3/19;
(Continued)

(56) References Cited

U.S. PATENT DOCUMENTS 4,797,898 A  1/1989 Martinez
5,793,821 A  8/1998 Norrell et al.
(Continued)

FOREIGN PATENT DOCUMENTS

CN  105812073 A  7/2016
CN  110798155 A  2/2020
(Continued)

OTHER PUBLICATIONS

U.S. Appl. No. 17/700,685, filed Mar. 22, 2022.
(Continued)

*Primary Examiner* — Golam Sorowar
(74) *Attorney, Agent, or Firm* — Withrow & Terranova, P.L.L.C.

(57) ABSTRACT

Envelope tracking (ET) voltage correction in a transmission circuit is provided. The transmission circuit includes a transceiver circuit and a power amplifier circuit(s). The transceiver circuit generates a radio frequency (RF) signal(s) from a time-variant modulation vector and the power amplifier circuit(s) amplifies the RF signal(s) based on a modulated voltage and provides the amplified RF signal(s) to a coupled RF front-end circuit. Herein, the transceiver circuit is configured to apply an equalization filter to a selected form of the time-variant modulation vector to compensate for a voltage distortion filter created across a modulation bandwidth of the RF signal(s) by coupling the power amplifier circuit with the RF front-end circuit. As a result, it is possible to reduce undesired instantaneous excessive compression and/or spectrum regrowth resulting from the voltage distortion filter to thereby improve efficiency and linearity of the power amplifier circuit(s) across the modulation bandwidth of the RF signal(s).

17 Claims, 6 Drawing Sheets

Related U.S. Application Data filed on Sep. 16, 2021, provisional application No. 63/212,418, filed on Jun. 18, 2021.

(51) Int. Cl.
  *H03F 1/32* (2006.01)
  *H03F 3/195* (2006.01)
  *H04B 1/04* (2006.01)

(52) U.S. Cl.
  CPC ..... *H04B 1/0475* (2013.01); *H03F 2200/102* (2013.01); *H03F 2200/451* (2013.01); *H04B 2001/0408* (2013.01)

(58) Field of Classification Search
  CPC .. H03F 3/195; H03F 1/0222; H03F 2200/336; H03F 3/24; H03F 3/21; H03F 1/32; H03F 1/3241; H03F 1/3247; H03F 2200/129; H03F 3/189; H03F 1/0233; H03F 1/0238; H03F 2201/3215; H03F 3/193; H03F 1/02; H03F 2200/411; H03F 2200/511; H03F 3/211; H03F 3/213; H03F 2200/504; H03F 1/0216; H03F 2200/375; H03F 1/0211; H04B 1/0475; H04B 2001/0408; H04B 2001/0425; H04B 1/40; H04B 17/13; H04B 1/16; H04B 2001/0441; H04B 1/0483; H04B 1/04
  See application file for complete search history.

(56) References Cited

U.S. PATENT DOCUMENTS

| | | | |
|---|---|---|---|
| 6,760,451 | B1 | 7/2004 | Craven et al. |
| 7,076,225 | B2 | 7/2006 | Li et al. |
| 7,430,248 | B2 | 9/2008 | McCallister |
| 7,663,436 | B2 | 2/2010 | Takano et al. |
| 7,683,713 | B2 | 3/2010 | Hongo |
| 7,859,338 | B2 | 12/2010 | Bajdechi et al. |
| 7,889,820 | B2 | 2/2011 | Murthy et al. |
| 8,605,819 | B2 | 12/2013 | Lozhkin |
| 8,749,309 | B2 | 6/2014 | Ho et al. |
| 8,831,544 | B2 | 9/2014 | Walker et al. |
| 9,036,734 | B1 | 5/2015 | Mauer et al. |
| 9,065,504 | B2 | 6/2015 | Kwon et al. |
| 9,112,413 | B2 | 8/2015 | Barth et al. |
| 9,356,760 | B2 | 5/2016 | Larsson et al. |
| 9,438,196 | B2 | 9/2016 | Smith et al. |
| 9,560,595 | B2 | 1/2017 | Dakshinamurthy et al. |
| 9,692,366 | B2 | 6/2017 | Pilgram |
| 9,705,477 | B2 | 7/2017 | Velazquez |
| 10,177,719 | B2 | 1/2019 | Gazneli et al. |
| 10,305,435 | B1 | 5/2019 | Murugesu et al. |
| 10,326,408 | B2 | 6/2019 | Khlat et al. |
| 10,361,744 | B1* | 7/2019 | Khlat ................ H04B 17/13 |
| 10,476,437 | B2 | 11/2019 | Nag et al. |
| 10,778,345 | B2 | 9/2020 | El-Hassan et al. |
| 11,005,368 | B2 | 5/2021 | Bansal et al. |
| 11,088,660 | B2 | 8/2021 | Lin et al. |
| 11,387,789 | B2 | 7/2022 | Khlat et al. |
| 11,424,719 | B2 | 8/2022 | Khlat |
| 11,569,783 | B2 | 1/2023 | Nomiyama et al. |
| 11,637,531 | B1 | 4/2023 | Perreault et al. |
| 2001/0054974 | A1 | 12/2001 | Wright |
| 2002/0190811 | A1 | 12/2002 | Sperber |
| 2003/0042979 | A1 | 3/2003 | Gurvich et al. |
| 2004/0239446 | A1 | 12/2004 | Gurvich et al. |
| 2005/0100105 | A1 | 5/2005 | Jensen |
| 2005/0254659 | A1 | 11/2005 | Heinsen |
| 2006/0068710 | A1 | 3/2006 | Jensen |
| 2006/0209981 | A1 | 9/2006 | Kluesing et al. |
| 2006/0217083 | A1 | 9/2006 | Braithwaite |
| 2007/0032208 | A1 | 2/2007 | Choi et al. |
| 2008/0246550 | A1 | 10/2008 | Biedka et al. |
| 2009/0004981 | A1 | 1/2009 | Eliezer et al. |
| 2009/0074106 | A1 | 3/2009 | See et al. |
| 2009/0125264 | A1 | 5/2009 | Betts et al. |
| 2009/0141830 | A1 | 6/2009 | Ye |
| 2009/0302945 | A1 | 12/2009 | Catoiu et al. |
| 2010/0298030 | A1 | 11/2010 | Howard |
| 2011/0182347 | A1 | 7/2011 | Cheung |
| 2011/0227767 | A1 | 9/2011 | O'Brien |
| 2012/0068748 | A1 | 3/2012 | Stojanovic et al. |
| 2012/0139635 | A1 | 6/2012 | Ho et al. |
| 2012/0189081 | A1 | 7/2012 | Omoto et al. |
| 2012/0256688 | A1 | 10/2012 | Onishi |
| 2013/0141062 | A1 | 6/2013 | Khlat |
| 2013/0222057 | A1 | 8/2013 | Henshaw |
| 2013/0243129 | A1 | 9/2013 | Okuni et al. |
| 2014/0028368 | A1 | 1/2014 | Khlat |
| 2014/0062599 | A1 | 3/2014 | Xu et al. |
| 2014/0065989 | A1 | 3/2014 | McLaurin |
| 2014/0072307 | A1 | 3/2014 | Zamani et al. |
| 2014/0084996 | A1 | 3/2014 | Schwent et al. |
| 2014/0105264 | A1 | 4/2014 | McLaurin et al. |
| 2014/0184337 | A1 | 7/2014 | Nobbe et al. |
| 2014/0213196 | A1 | 7/2014 | Anger et al. |
| 2014/0232470 | A1 | 8/2014 | Wilson |
| 2014/0266432 | A1 | 9/2014 | Scott et al. |
| 2014/0315504 | A1 | 10/2014 | Sakai et al. |
| 2014/0361837 | A1 | 12/2014 | Strange et al. |
| 2015/0028946 | A1 | 1/2015 | Al-Qaq et al. |
| 2016/0173030 | A1 | 6/2016 | Langer et al. |
| 2016/0182100 | A1 | 6/2016 | Menkhoff et al. |
| 2016/0301432 | A1 | 10/2016 | Shizawa et al. |
| 2017/0005676 | A1 | 1/2017 | Yan et al. |
| 2017/0104502 | A1 | 4/2017 | Pratt |
| 2017/0149457 | A1 | 5/2017 | Mayer et al. |
| 2017/0170838 | A1 | 6/2017 | Pagnanelli |
| 2017/0338842 | A1 | 11/2017 | Pratt |
| 2018/0034418 | A1 | 2/2018 | Blednov |
| 2018/0248570 | A1 | 8/2018 | Camuffo |
| 2019/0041890 | A1 | 2/2019 | Chen et al. |
| 2019/0058530 | A1 | 2/2019 | Rainish et al. |
| 2019/0068234 | A1 | 2/2019 | Khlat et al. |
| 2019/0238152 | A1 | 8/2019 | Pagnanelli |
| 2019/0245496 | A1 | 8/2019 | Khlat et al. |
| 2019/0296929 | A1* | 9/2019 | Milicevic ............. H04B 1/1018 |
| 2019/0319583 | A1 | 10/2019 | El-Hassan et al. |
| 2019/0356285 | A1 | 11/2019 | Khlat et al. |
| 2020/0106392 | A1 | 4/2020 | Khlat et al. |
| 2020/0136563 | A1 | 4/2020 | Khlat |
| 2020/0259685 | A1 | 8/2020 | Khlat |
| 2020/0295713 | A1 | 9/2020 | Khlat |
| 2020/0336111 | A1 | 10/2020 | Khlat |
| 2021/0194517 | A1 | 6/2021 | Mirea et al. |
| 2021/0281228 | A1 | 9/2021 | Khlat |
| 2021/0399690 | A1 | 12/2021 | Panseri et al. |
| 2022/0216834 | A1 | 7/2022 | Myoung et al. |
| 2022/0360229 | A1 | 11/2022 | Khlat |
| 2022/0407462 | A1 | 12/2022 | Khlat |
| 2022/0407463 | A1 | 12/2022 | Khlat et al. |
| 2022/0407464 | A1 | 12/2022 | Khlat et al. |
| 2022/0407465 | A1 | 12/2022 | Khlat |
| 2023/0079153 | A1 | 3/2023 | Khlat |
| 2023/0080621 | A1 | 3/2023 | Khlat |
| 2023/0080652 | A1 | 3/2023 | Khlat et al. |
| 2023/0081095 | A1 | 3/2023 | Khlat |
| 2023/0082145 | A1 | 3/2023 | Lin et al. |
| 2023/0238927 | A1 | 7/2023 | Kay et al. |

FOREIGN PATENT DOCUMENTS

| | | |
|---|---|---|
| EP | 2705604 A2 | 3/2014 |
| EP | 2582041 B1 | 4/2018 |
| EP | 2232713 B1 | 10/2018 |
| EP | 3416340 A1 | 12/2018 |
| WO | 2007092794 A2 | 8/2007 |
| WO | 2010135711 A1 | 11/2010 |
| WO | 2014026178 A1 | 2/2014 |
| WO | 2023150539 A1 | 8/2023 |
| WO | 2023150545 A1 | 8/2023 |

(56) References Cited

FOREIGN PATENT DOCUMENTS

OTHER PUBLICATIONS

U.S. Appl. No. 17/689,232, filed Mar. 8, 2022.
U.S. Appl. No. 17/714,244, filed Apr. 6, 2022.
International Search Report and Written Opinion for International Patent Application No. PCT/US2023/060303, mailed Apr. 11, 2023, 12 pages.
Advisory Action for U.S. Appl. No. 17/942,472, mailed Sep. 15, 2023, 3 pages.
Notice of Allowance for U.S. Appl. No. 17/942,472, mailed Oct. 18, 2023, 10 pages.
International Search Report and Written Opinion for International Patent Application No. PCT/US2023/019267, mailed Aug. 3, 2023, 14 pages.
Williams, P., "Crossover Filter Shape Comparisons," White Paper, Linea Research, Jul. 2013, 13 pages.
Corrected Notice of Allowability for U.S. Appl. No. 17/942,472, mailed Nov. 17, 2023, 6 pages.
Non-Final Office Action for U.S. Appl. No. 17/939,350, mailed Jan. 17, 2024, 11 pages.
Paek, J.-S. et al., "Design of Boosted Supply Modulator With Reverse Current Protection for Wide Battery Range in Envelope Tracking Operation," IEEE Transactions on Microwave Theory and Techniques, vol. 67, No. 1, Jan. 2019, pp. 183-194.
Non-Final Office Action for U.S. Appl. No. 17/700,685, mailed Dec. 22, 2023, 24 pages.
Non-Final Office Action for U.S. Appl. No. 17/689,232, mailed Dec. 11, 2023, 27 pages.
Notice of Allowance and Examiner-Initiated Interview Summary for U.S. Appl. No. 17/737,300, mailed Dec. 19, 2023, 12 pages.
Notice of Allowance for U.S. Appl. No. 17/700,700, mailed Oct. 23, 2023, 9 pages.
Supplemental Notice of Allowability for U.S. Appl. No. 17/700,700, mailed Nov. 8, 2023, 5 pages.
Extended European Search Report for European Patent Application No. 23174010.1, mailed Oct. 10, 2023, 10 pages.
Corrected Notice of Allowability for U.S. Appl. No. 17/737,300, mailed Dec. 27, 2023, 8 pages.
Final Office Action for U.S. Appl. No. 17/942,472, mailed Jul. 19, 2023, 16 pages.
Cho, M., "Analog Predistortion for Improvement of RF Power Amplifier Efficiency and Linearity," A Dissertation presented to the Academic Faculty in partial fulfillment of the requirements for the degree Doctor of Philosophy in the School of Electrical and Computer Engineering, Georgia Institute of Technology, Aug. 2016, available from the Internet: [URL: https://repository.gatech.edu/server/api/core/bitstreams/b8fe5cbb-e5db-4efe-b9a2-eaad5f671f14/content], 113 pages.
Kwak, T.-W. et al., "A 2W CMOS Hybrid Switching Amplitude Modulator for EDGE Polar Transmitters," IEEE Journal of Solid-State Circuits, vol. 42, No. 12, Dec. 2007, IEEE, pp. 2666-2676.
Paek, J.-S. et al., "A -137 dBm/Hz Noise, 82% Efficiency AC-Coupled Hybrid Supply Modulator With Integrated Buck-Boost Converter," IEEE Journal of Solid-State Circuits, vol. 51, No. 11, Nov. 2016, IEEE pp. 2757-2768.

Non-Final Office Action for U.S. Appl. No. 17/737,300, mailed Aug. 28, 2023, 14 pages.
Extended European Search Report for European Patent Application No. 23153108.8, mailed Jun. 20, 2023, 18 pages.
Non-Final Office Action for U.S. Appl. No. 17/700,700, mailed Apr. 13, 2023, 11 pages.
Bai, W.-D. et al., "Principle of Vector Synthesis Predistortion Linearizers Controlling AM/AM and AM/PM Independently," 2016 IEEE International Conference on Ubiquitous Wireless Broadband (ICUWB), Oct. 16-19, 2016, Nanjing, China, IEEE, 3 pages.
Extended European Search Report for European Patent Application No. 22195695.6, mailed Feb. 14, 2023, 12 pages.
Extended European Search Report for European Patent Application No. 22196188.1, mailed Feb. 2, 2023, 25 pages.
Advisory Action U.S. Appl. No. 17/689,232, mailed May 23, 2024, 3 pages.
Non-Final Office Action for U.S. Appl. No. 17/689,232, mailed Jul. 17, 2024, 22 pages.
Final Office Action for U.S. Appl. No. 17/939,350, mailed May 21, 2024, 11 pages.
International Search Report and Written Opinion for International Patent Application No. PCT/US2023/061734, mailed May 30, 2023, 15 pages.
International Search Report and Written Opinion for International Patent Application No. PCT/US2023/061741, mailed Jun. 1, 2023, 14 pages.
Invitation to Pay Additional Fees and Partial International Search for International Patent Application No. PCT/US2023/061804, mailed May 26, 2023, 10 pages.
International Search Report and Written Opinion for International Patent Application No. PCT/US2023/061804, mailed Jul. 17, 2023, 20 pages.
International Search Report and Written Opinion for International Patent Application No. PCT/US2022/043600, mailed Jan. 11, 2023, 15 pages.
Non-Final Office Action for U.S. Appl. No. 17/942,472, mailed Feb. 16, 2023, 13 pages.
Extended European Search Report for European Patent Application No. 22195382.1, mailed Feb. 1, 2023, 26 pages.
Extended European Search Report for European Patent Application No. 22195683.2, mailed Feb. 10, 2023, 12 pages.
Notice of Allowance for U.S. Appl. No. 17/700,685, mailed Apr. 5, 2024, 7 pages.
Final Office Action for U.S. Appl. No. 17/689,232, mailed Mar. 26, 2024, 28 pages.
Supplemental Notice of Allowability for U.S. Appl. No. 17/700,700, mailed Feb. 28, 2024, 5 pages.
Notice of Allowance for U.S. Appl. No. 17/689,232, mailed Oct. 21, 2024, 10 pages.
Notice of Allowance for U.S. Appl. No. 17/714,244, mailed Sep. 16, 2024, 8 pages.
Non-Final Office Action for U.S. Appl. No. 17/939,350, mailed Sep. 6, 2024, 8 pages.
Non-Final Office Action for U.S. Appl. No. 17/890,538, mailed Oct. 21, 2024, 13 pages.

* cited by examiner

ENVELOPE TRACKING VOLTAGE CORRECTION IN A TRANSMISSION CIRCUIT

RELATED APPLICATIONS

This application claims the benefit of provisional patent application Ser. No. 63/212,418, filed Jun. 18, 2021, provisional patent application Ser. No. 63/245,156, filed Sep. 16, 2021, and provisional patent application Ser. No. 63/245,145, filed Sep. 16, 2021, the disclosures of which are hereby incorporated herein by reference in their entirety.

FIELD OF THE DISCLOSURE

The technology of the disclosure relates generally to a transmission circuit that transmits a radio frequency (RF) signal modulated in a wide modulation bandwidth.

BACKGROUND

Mobile communication devices have become increasingly common in current society for providing wireless communication services. The prevalence of these mobile communication devices is driven in part by the many functions that are now enabled on such devices. Increased processing capability in such devices means that mobile communication devices have evolved from being pure communication tools into sophisticated mobile multimedia centers that enable enhanced user experiences.

The redefined user experience relies on a higher data rate offered by advanced fifth generation (5G) and 5G new radio (5G-NR) technologies, which typically transmit and receive radio frequency (RF) signals in millimeter wave spectrums. Given that the RF signals are more susceptible to attenuation and interference in the millimeter wave spectrums, the RF signals are typically amplified by state-of-the-art power amplifiers to help boost the RF signals to higher power before transmission.

Envelope tracking (ET) is a power management technology designed to improve operating efficiency and/or linearity performance of the power amplifiers. In an ET power management circuit, a power management integrated circuit (PMIC) is configured to generate a time-variant ET voltage based on a time-variant voltage envelope of the RF signals, and the power amplifiers are configured to amplify the RF signals based on the time-variant ET voltage. Understandably, the better the time-variant ET voltage is aligned with the time-variant voltage envelope in time and amplitude, the better the performance (e.g., efficiency and/or linearity) that can be achieved at the power amplifiers. However, the time-variant ET voltage can become misaligned from the time-variant voltage envelope in time and/or amplitude due to a range of factors (e.g., group delay, impedance mismatch, etc.). As such, it is desirable to maintain good alignment between the time-variant voltage and the time-variant voltage envelope at all times and across a wide modulation bandwidth.

SUMMARY

Embodiments of the disclosure relate to envelope tracking (ET) voltage correction in a transmission circuit. The transmission circuit includes a transceiver circuit and a power amplifier circuit(s). The transceiver circuit generates a radio frequency (RF) signal(s) from a time-variant modulation vector and provides the RF signal(s) to the power amplifier circuit(s). The power amplifier circuit(s) amplifies the RF signal(s) based on a modulated voltage and provides the amplified RF signal(s) to a coupled RF front-end circuit (e.g., filter/multiplexer circuit). Notably, when the power amplifier circuit(s) is coupled to the RF front-end circuit, an output reflection coefficient (e.g., $S_{22}$) of the power amplifier circuit(s) can interact with an input reflection coefficient (e.g., $S_{11}$) of the RF front-end circuit to create a voltage distortion filter on an output stage of the power amplifier circuit(s), which can cause unwanted distortion in the modulated voltage across a modulation bandwidth of the RF signal(s). In this regard, in embodiments disclosed herein, the transceiver circuit is configured to apply an equalization filter to a selected form of the time-variant modulation vector to compensate for a voltage distortion filter created across the modulation bandwidth of the RF signal(s) by coupling the power amplifier circuit with the RF front-end circuit. As a result, it is possible to reduce undesired instantaneous excessive compression and/or spectrum regrowth resulted from the voltage distortion filter to thereby improve efficiency and linearity of the power amplifier circuit(s) across the modulation bandwidth of the RF signal(s).

In one aspect, a transmission circuit is provided. The transmission circuit includes a power amplifier circuit coupled to a transmitter circuit via an RF front-end circuit. The power amplifier circuit is configured to amplify an RF signal based on a modulated voltage and provide the amplified RF signal to the RF front-end circuit. The transmission circuit also includes an ET integrated circuit (ETIC). The ETIC is configured to generate the modulated voltage based on a modulated target voltage. The transmission circuit also includes a transceiver circuit. The transceiver circuit includes a signal processing circuit. The signal processing circuit is configured to generate the RF signal from a time-variant modulation vector. The transceiver circuit also includes a target voltage circuit. The target voltage circuit includes an ET lookup table (LUT) circuit. The ET LUT circuit is configured according to a selected frequency of the RF signal to generate the modulated target voltage as a function of the time-variant modulation vector. The target voltage circuit also includes an equalizer circuit. The equalizer circuit is configured to apply an equalization filter to a selected form of the time-variant modulation vector to compensate for a voltage distortion filter created on an output stage of the power amplifier circuit by coupling the power amplifier circuit with the RF front-end circuit across a modulation bandwidth comprising the selected frequency.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1A:
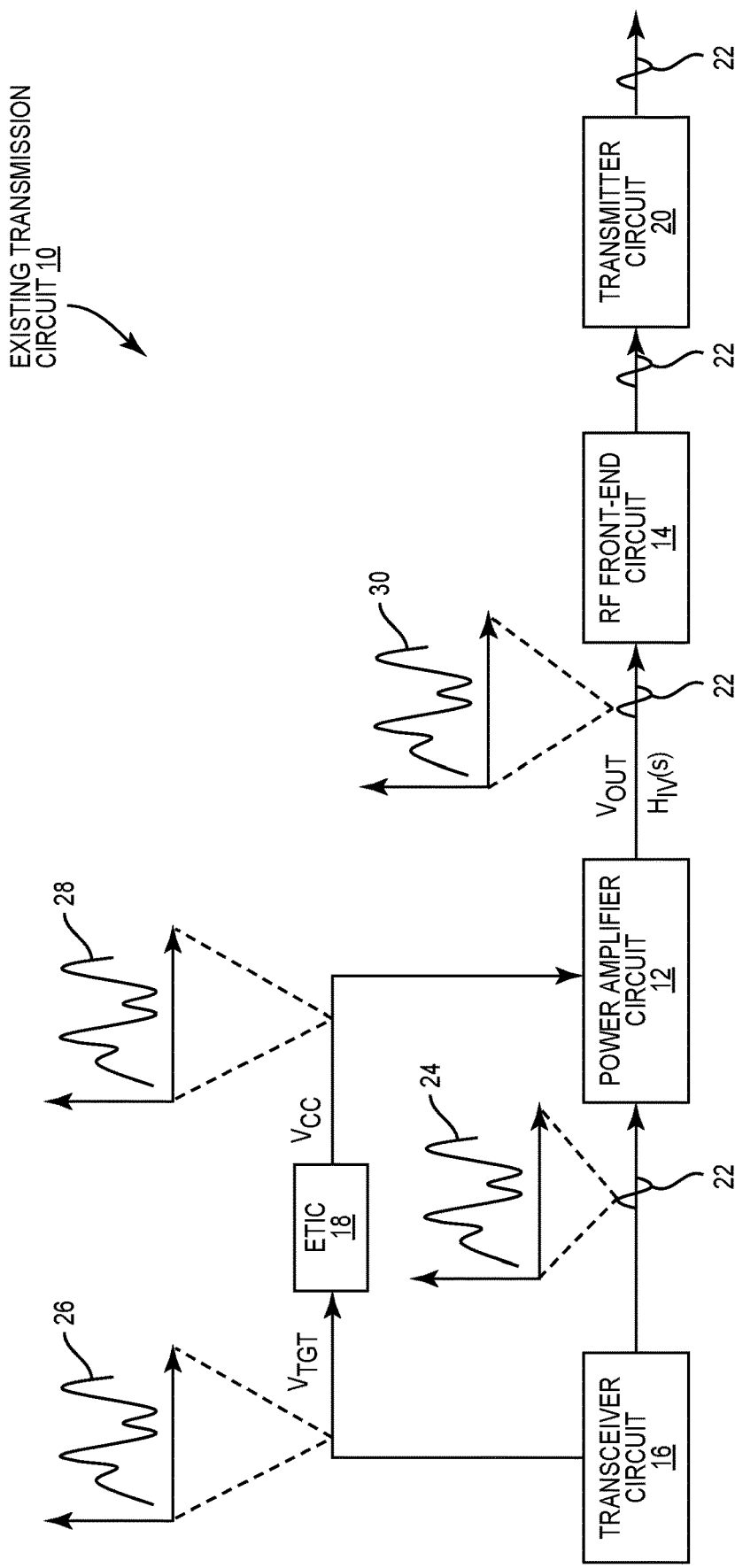
FIG. 1A is a schematic diagram of an exemplary existing transmission circuit, wherein an unwanted voltage distortion filter may be created on a power amplifier circuit when the power amplifier circuit is coupled to a radio frequency (RF) front-end circuit.
Figure 3:
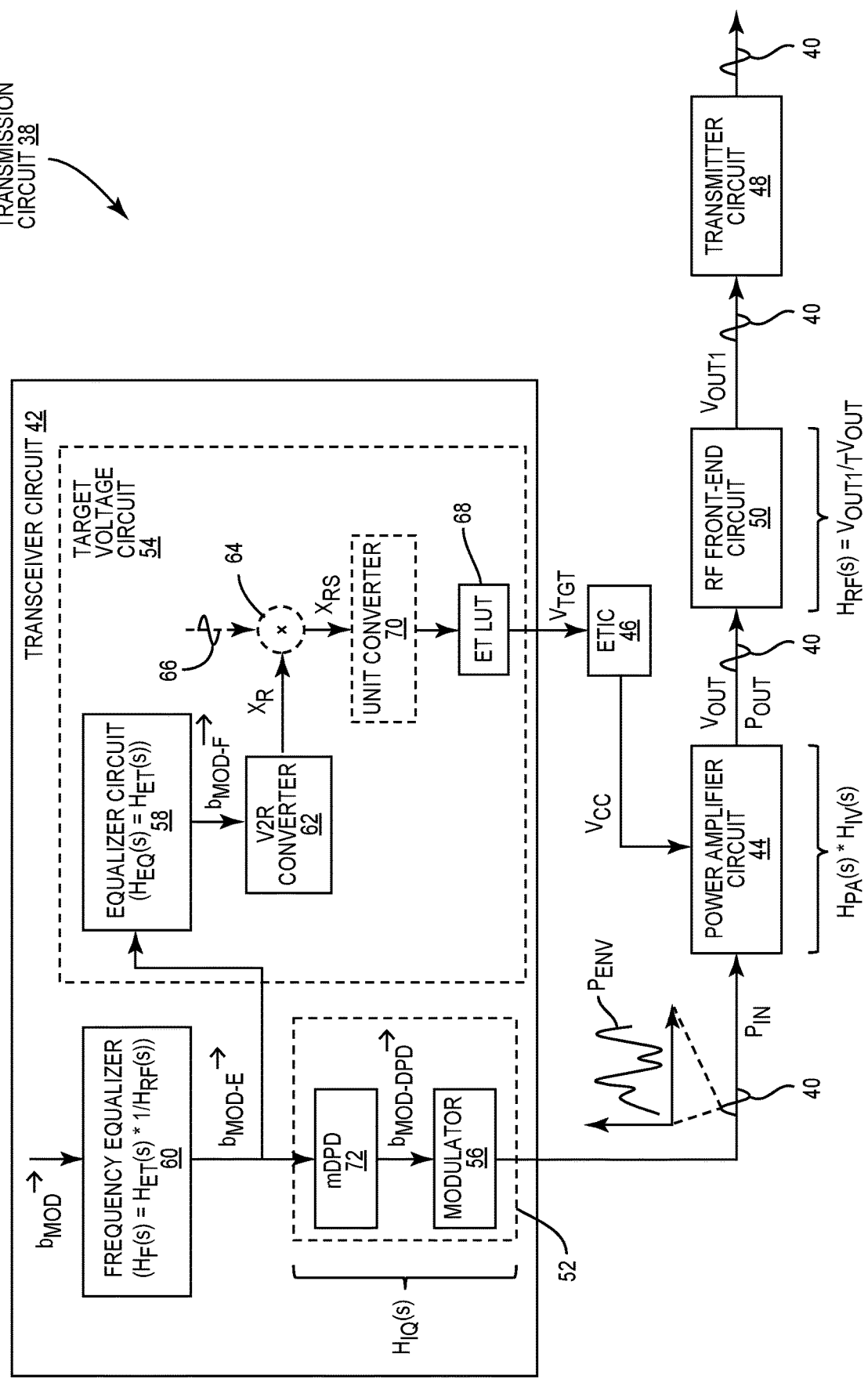
FIG. 3 is a schematic diagram of an exemplary transmission circuit configured according to an embodiment of the present disclosure to compensate for the unwanted voltage distortion filter in the existing transmission circuit of FIG. 1A.
Figure 4:
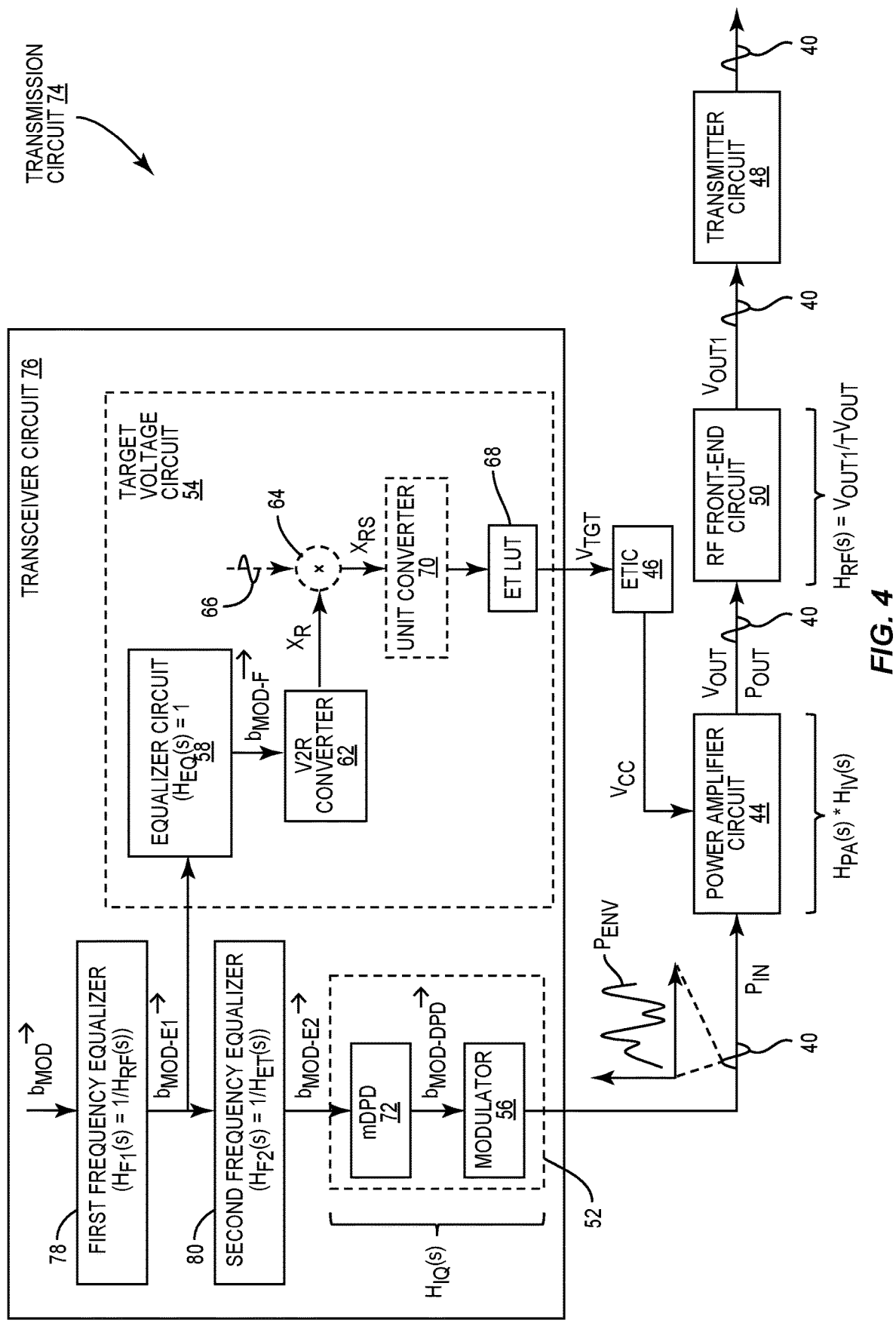
Figure 5:
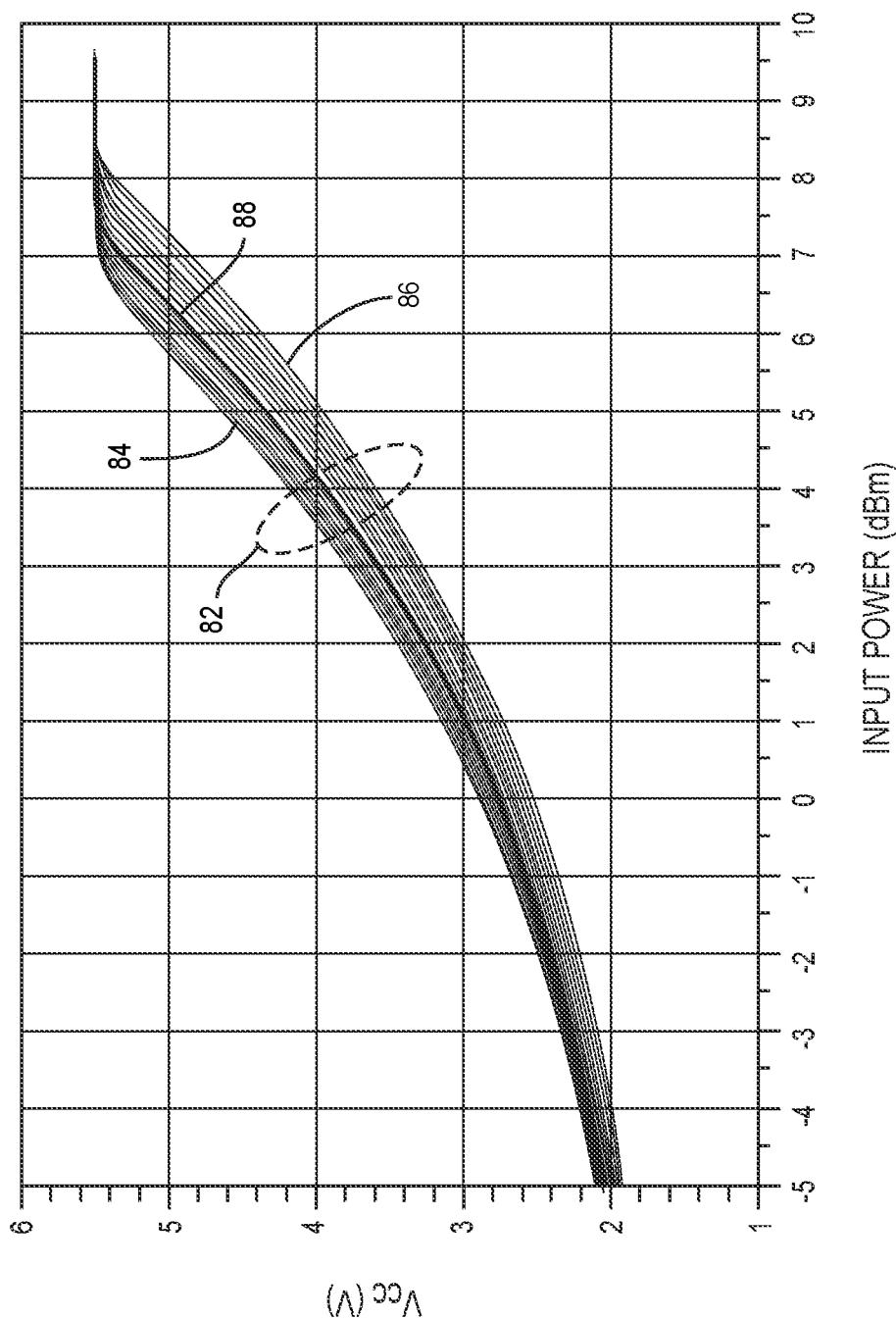

FIG. 4 is a schematic diagram of an exemplary transmission circuit configured according to another embodiment of the present disclosure to compensate for the unwanted voltage distortion filter in the existing transmission circuit of FIG. 1A; and FIG. 5 is a graphic diagram providing an exemplary illustration of a modulation bandwidth in which the transmission circuits of FIGS. 3 and 4 can be configured to compensate for the unwanted voltage distortion filter in the existing transmission circuit of FIG. 1A.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to envelope tracking (ET) voltage correction in a transmission circuit. The transmission circuit includes a transceiver circuit and a power amplifier circuit(s). The transceiver circuit generates a radio frequency (RF) signal(s) from a time-variant modulation vector and provides the RF signal(s) to the power amplifier circuit(s). The power amplifier circuit(s) amplifies the RF signal(s) based on a modulated voltage and provides the amplified RF signal(s) to a coupled RF front-end circuit (e.g., filter/multiplexer circuit). Notably, when the power amplifier circuit(s) is coupled to the RF front-end circuit, an output reflection coefficient (e.g., $S_{22}$) of the power amplifier circuit(s) can interact with an input reflection coefficient (e.g., $S_{11}$) of the RF front-end circuit to create a voltage distortion filter on an output stage of the power amplifier circuit(s), which can cause unwanted distortion in the modulated voltage across a modulation bandwidth of the RF signal(s). In this regard, in embodiments disclosed herein, the transceiver circuit is configured to apply an equalization filter to a selected form of the time-variant modulation vector to compensate for a voltage distortion filter created across the modulation bandwidth of the RF signal(s) by coupling the power amplifier circuit with the RF front-end circuit. As a result, it is possible to reduce undesired instantaneous excessive compression and/or spectrum regrowth resulting from the voltage distortion filter to thereby improve efficiency and linearity of the power amplifier circuit(s) across the modulation bandwidth of the RF signal (s).

Figure 2:
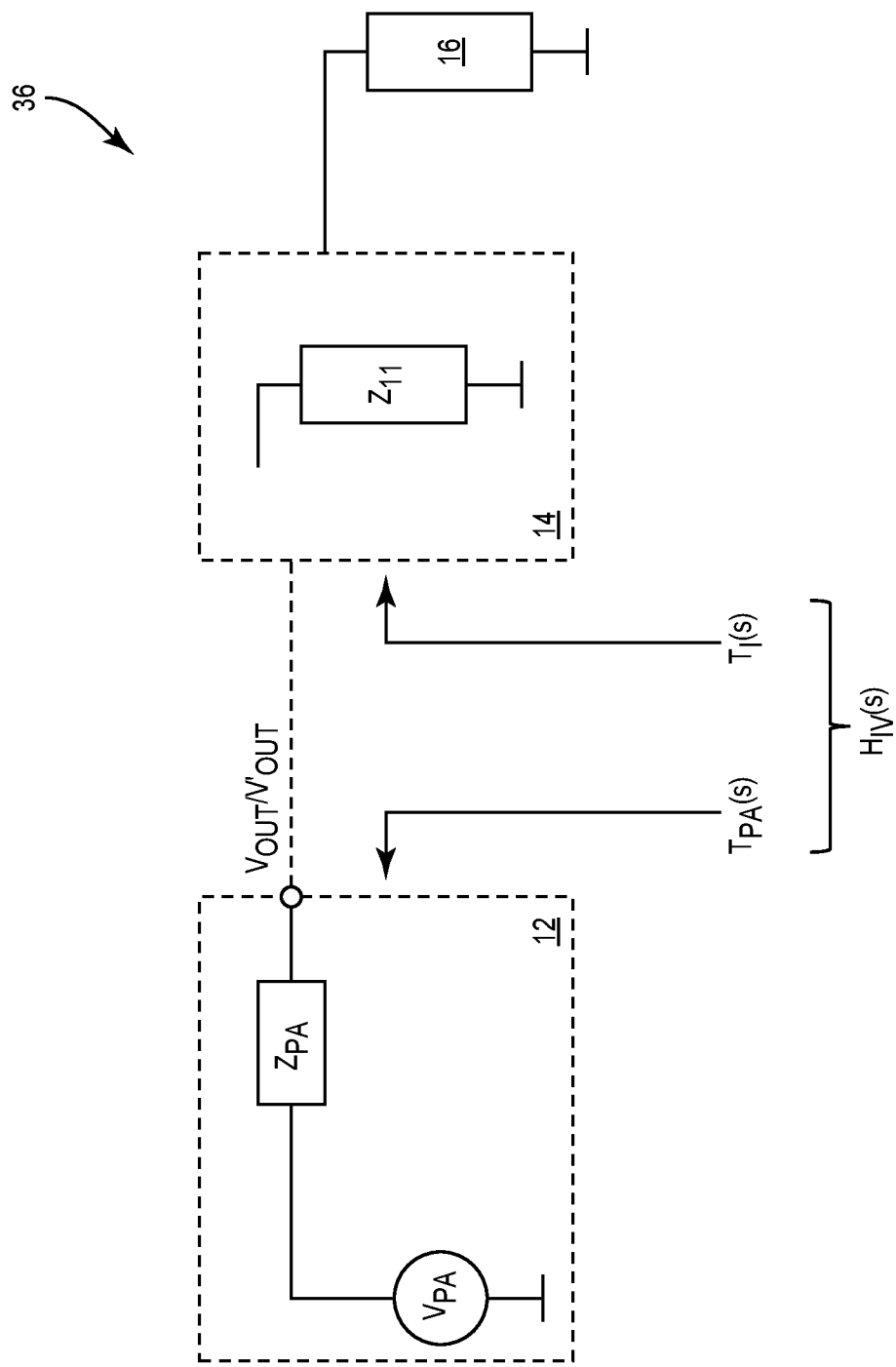
FIG. 2 is a schematic diagram of an exemplary equivalent model providing an exemplary illustration of the unwanted voltage distortion filter created by a coupling between the power amplifier circuit and the RF front-end circuit 14 in FIG. 1A.

Before discussing the transmission circuit according to the present disclosure, starting at FIG. 2, a brief discussion of an existing transmission circuit is first provided to help understand how an unwanted voltage distortion filter may be created when a power amplifier circuit is coupled to an RF front-end circuit, such as a filter/multiplexer circuit.

FIG. 1A is a schematic diagram of an exemplary existing transmission circuit 10, wherein an unwanted voltage distortion filter $H_{IV}(s)$ may be created on a power amplifier circuit 12 when the power amplifier circuit 12 is coupled to an RF front-end circuit 14. Notably, in the unwanted voltage distortion filter $H_{IV}(s)$, "s" is a notation of Laplace transform. The existing transmission circuit 10 includes a transceiver circuit 16, an envelope tracking (ET) integrated circuit (ETIC) 18, and a transmitter circuit 20, which can include an antenna(s) (not shown) as an example.

The transceiver circuit 16 is configured to generate an RF signal 22 associated with a time-variant voltage envelope 24 and provides the RF signal 22 to the power amplifier circuit 12. The transceiver circuit 16 is also configured to generate a time-variant target voltage $V_{TGT}$, which is associated with a time-variant target voltage 26 that tracks the time-variant voltage envelope 24 of the RF signal 22. The ETIC 18 is configured to generate a modulated voltage $V_{CC}$ having a time-variant modulated voltage 28 that tracks the time-variant target voltage 26 of the time-variant target voltage $V_{TGT}$ and provide the modulated voltage $V_{CC}$ to the power amplifier circuit 12. The power amplifier circuit 12 is configured to amplify the RF signal 22 based on the modulated voltage $V_{CC}$ to a time-variant output voltage $V_{OUT}$ associated with a time-variant output voltage envelope 30. The power amplifier circuit 12 then provides the amplified RF signal 22 to the RF front-end circuit 14. The RF front-end circuit 14 may be a filter circuit that performs further frequency filtering on the amplified RF signal 22 before providing the amplified RF signal 22 to the transmitter circuit 20 for transmission.

Figure 1B:
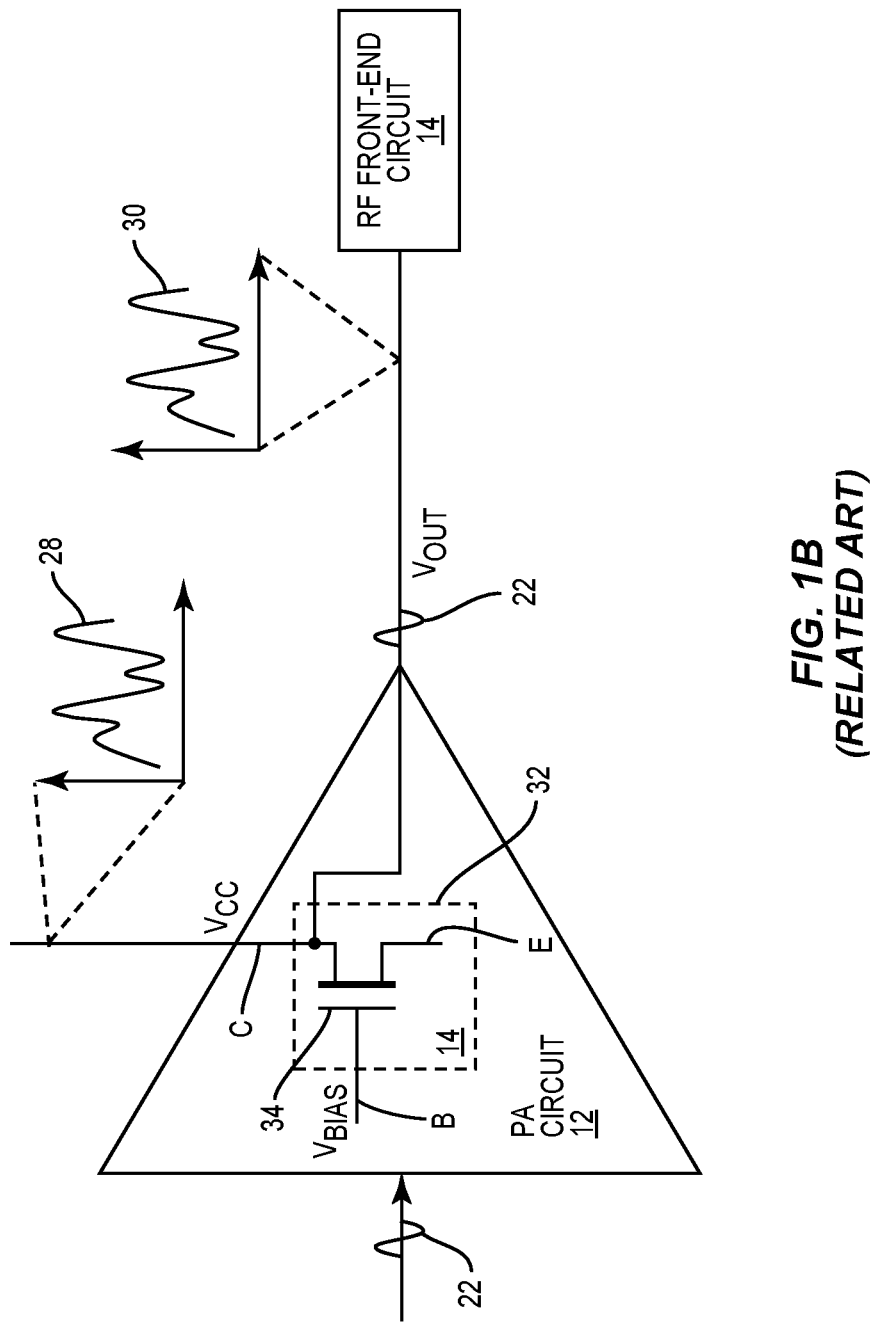
FIG. 1B is a schematic diagram providing an exemplary illustration of an output stage of the power amplifier circuit in FIG. 1A.

FIG. 1B is a schematic diagram providing an exemplary illustration of an output stage 32 of the power amplifier circuit 12 in FIG. 1A. Common elements between FIGS. 1A and 1B are shown therein with common element numbers and will not be re-described herein.

The output stage 32 can include at least one transistor 34, such as a bipolar junction transistor (BJT) or a complementary metal-oxide semiconductor (CMOS) transistor. Taking the BJT as an example, the transistor 34 can include a base electrode B, a collector electrode C, and an emitter electrode E. The base electrode B is configured to receive a bias voltage $V_{BIAS}$ and the collector electrode C is configured to receive the modulated voltage $V_{CC}$. The collector electrode C is also coupled to the RF front-end circuit 14 and configured to output the amplified RF signal 22 at the output voltage $V_{OUT}$. In this regard, the output voltage $V_{OUT}$ can be a function of the modulated voltage $V_{CC}$. Understandably, the power amplifier circuit 12 will operate with good efficiency and linearity when the time-variant modulated voltage 28 is aligned with the time-variant output voltage envelope 30.

FIG. 2 is a schematic diagram of an exemplary equivalent model 36 providing an exemplary illustration of the voltage distortion filter $H_{IV}(s)$ created by a coupling between the power amplifier circuit 12 and the RF front-end circuit 14 in the existing transmission circuit 10 of FIG. 1A. Elements in FIGS. 1A and 1B are referenced in FIG. 2 without being re-described herein.

In the equivalent model 36, $V_{PA}$ and $Z_{PA}$ represent the output stage 32 of the power amplifier circuit 12 and an inherent impedance of the power amplifier circuit 12, respectively, and $Z_{11}$ represents an inherent impedance associated with an input port of the RF front-end circuit 14. Herein, $V_{OUT}$ represents an output voltage associated with the RF signal 22 before the power amplifier circuit 12 is coupled to the RF front-end circuit 14, and $V'_{OUT}$ represents an output voltage associated with the RF signal 22 after the power amplifier circuit 12 is coupled to the RF front-end circuit 14. Hereinafter, the output voltages $V_{OUT}$ and $V'_{OUT}$ are referred to as "non-coupled output voltage" and "coupled output voltage," respectively, for distinction.

A Laplace transform representative of the coupled output voltage $V'_{OUT}$ can be expressed in equation (Eq. 1) below.

$$V'_{OUT}(s) = \frac{V_{OUT}(s) * [1 - T_{PA}(s)] * [1 + T_I(s)]}{2 * [1 - T_{PA}(s) * T_I(s)]} = V_{OUT}(s) * H_{IV}(s) \quad \text{(Eq. 1)}$$

$$H_{IV}(s) = \frac{[1 - T_{PA}(s)] * [1 + T_I(s)]}{2 * [1 - T_{PA}(s) * T_I(s)]}$$

In the equation (Eq. 1) above, $T_{PA}(s)$ represents a reflection coefficient looking back into the output stage 32 of the power amplifier circuit 12 and $T_I(s)$ represents a reflection coefficient looking into the RF front-end circuit 14. Notably, $T_{PA}(s)$ and $T_I(s)$ are complex filters containing amplitude and phase information. In this regard, the $T_{PA}(s)$, the $T_I(s)$, and, therefore, the voltage distortion filter $H_{IV}(s)$ are dependents of such factors as modulation bandwidth, RF spectrum, and/or voltage standing wave ratio (VSWR).

The equation (Eq. 1) shows that the coupled output voltage $V'_{OUT}$ will be altered from the non-coupled output voltage $V_{OUT}$ by the voltage distortion filter $H_{IV}(s)$ when the power amplifier circuit 12 is coupled to the RF front-end circuit 14. Moreover, the variation of the non-coupled output voltage $V_{OUT}$ caused by the voltage distortion filter $H_{IV}(s)$ can happen across an entire modulation bandwidth of the RF signal 22. As a result, the coupled output voltage $V'_{OUT}$ may become misaligned from the modulated voltage $V_{CC}$ across the modulation bandwidth of the RF signal 22, thus causing unwanted distortion in the RF signal 22.

According to various embodiments disclosed herein, it is possible to modify the modulated voltage $V_{CC}$ to compensate for the voltage distortion filter $H_{IV}(s)$ to thereby reduce or eliminate the difference between the non-coupled output voltage $V_{OUT}$ and the coupled output voltage $V'_{OUT}$ across the modulation bandwidth of the RF signal 22. As a result, it is possible to reduce undesired instantaneous excessive compression and/or spectrum regrowth resulting from the voltage distortion filter $H_{IV}(s)$ across the modulation bandwidth of the RF signal 22.

FIG. 3 is a schematic diagram of an exemplary transmission circuit 38 configured according to an embodiment of the present disclosure to compensate for the unwanted voltage distortion filter $H_{IV}(s)$ in the existing transmission circuit 10 of FIG. 1A. The transmission circuit 38 is configured to transmit an RF signal 40 modulated in a wide modulation bandwidth. Herein, a modulation bandwidth refers to a range of RF frequencies that the RF signal 40 may be modulated onto. For example, if the RF signal 40 can be modulated between 2554 MHz and 2654 MHz, the modulation bandwidth will then be 100 MHz. In a non-limiting example, the RF signal 40 can be modulated in a modulation bandwidth of 200 MHz or higher and transmitted in a millimeter wave RF spectrum.

The transmission circuit 38 includes a transceiver circuit 42, a power amplifier circuit 44, and an ETIC 46. The power amplifier circuit 44 is coupled to a transmitter circuit 48 (e.g., an antenna circuit) via an RF front-end circuit 50. In a non-limiting example, the RF front-end circuit 50 can include one or more of a filter circuit and a multiplexer circuit (not shown). The filter circuit may be configured to include a filter network, such as an acoustic filter network with a sharp cutoff frequency. The power amplifier circuit 44 may be identical to or functionally equivalent to the power amplifier circuit 12 in FIG. 1B. As such, the power amplifier circuit 44 may also include the output stage 32 as in the power amplifier circuit 12.

The transceiver circuit 42 includes a signal processing circuit 52 and a target voltage circuit 54. The signal processing circuit 52 is configured to generate the RF signal 40 from a time-variant modulation vector $\vec{b}_{MOD}$ associated with time-variant amplitudes. The time-variant modulation vector $\vec{b}_{MOD}$ may be generated by a digital baseband circuit (not shown) in the transceiver circuit 42 and includes both in-phase (I) and quadrature (Q) components. Since the time-variant modulation vector $\vec{b}_{MOD}$ is generated in a digital domain, the I and Q components can thus provide a time-variant digital representation of the time-variant amplitudes of the time-variant modulation vector $\vec{b}_{MOD}$.

The signal processing circuit 52 further includes a modulator circuit 56, which is configured to generate the RF signal 40 in an analog domain based on the time-variant modulation vector $\vec{b}_{MOD}$ and modulate the RF signal 40 onto a selected frequency that falls within the modulation bandwidth of the transmission circuit 38. Understandably, since the modulator circuit 56 generates the RF signal 40 from the time-variant modulation vector $\vec{b}_{MOD}$, the RF signal 40 will be associated with a time-variant power envelope $P_{ENV}$ that tracks the time-variant amplitudes of the time-variant modulation vector $\vec{b}_{MOD}$. Accordingly, the I and Q components can also provide a digital representation of the time-variant power envelope $P_{ENV}$ of the RF signal 40.

The target voltage circuit 54 is configured to generate a modulated target voltage $V_{TGT}$ as a function of the time-variant modulation vector $\vec{b}_{MOD}$. The ETIC 46 is configured to generate a modulated voltage $V_{CC}$ based on the modulated target voltage $V_{TGT}$ and provide the modulated voltage $V_{CC}$ to the power amplifier circuit 44. The power amplifier circuit 44, in turn, amplifies the RF signal 40 from an input power $P_{IN}$ to an output power $P_{OUT}$, which corresponds to an output voltage $V_{OUT}$, based on the modulated voltage $V_{CC}$. The RF front-end circuit 50 may perform further processes (e.g., filtering, frequency conversion, etc.) on the RF signal 40. As a result, the RF front-end circuit 50 may cause the RF signal 40 to have another output voltage $V_{OUT1}$, which can be different from the output voltage $V_{OUT}$. Subsequently, the RF front-end circuit 50 provides the RF signal 40 to the transmitter circuit 48 for transmission in the selected frequency.

Understandably, the closer the modulated voltage $V_{CC}$ can track the time-variant power envelope $P_{ENV}$ of the RF signal 40, the better efficiency and linearity can be achieved at the power amplifier circuit 44. However, the voltage distortion filter $H_{IV}(s)$ resulting from coupling the power amplifier circuit 44 with the RF front-end circuit 50 can change the non-coupled output voltage $V_{OUT}$ to the coupled output voltage $V'_{OUT}$. As a result, the power amplifier circuit 44 can cause undesired instantaneous excessive compression and/or spectrum regrowth in the modulation bandwidth of the transmission circuit 38. As such, it is desirable to reduce the undesired instantaneous excessive compression and/or spectrum regrowth across the modulation bandwidth of the transmission circuit 38.

As previously described in FIG. 1B, the output voltage $V_{OUT}$ is a function of the modulated voltage $V_{CC}$. In this regard, it is possible to reduce or even eliminate the difference between the non-coupled output voltage $V_{OUT}$ and the coupled output voltage $V'_{OUT}$ by generating the modulated voltage $V_{CC}$ to compensate for the voltage distortion filter $H_{IV}(s)$. Given that the ETIC 46 is configured to generate the modulated voltage $V_{CC}$ based on the modulated target voltage $V_{TGT}$, it is thus possible to reduce or even eliminate the difference between the non-coupled output voltage $V_{OUT}$ and the coupled output voltage $V'_{OUT}$ by generating the modulated target voltage $V_{TGT}$ to compensate for the voltage distortion filter $H_{IV}(s)$.

In this regard, the transceiver circuit 42 further includes an equalizer circuit 58. The equalizer circuit 58 is configured to apply an equalization filter $H_{EQ}(s)$ to a selected form of the time-variant modulation vector $\vec{b}_{MOD}$ prior to generating the modulated target voltage $V_{TGT}$. In an embodiment, the equalization filter $H_{EQ}(s)$ can be described by equation (Eq. 2) below.

$$H_{EQ}(s)=H_{ET}(s)=H_{IQ}(s)*H_{PA}(s)*H_{IV}(s) \qquad \text{(Eq. 2)}$$

In the equation (Eq. 2) above, $H_{IQ}(s)$ represents a transfer function of the signal processing circuit 52, and $H_{PA}(s)$ represents a voltage gain transfer function of the power amplifier circuit 44. In this regard, $H_{ET}(s)$ is a combined complex filter configured to match a combined signal path filter that includes the transfer function $H_{IQ}(s)$, the voltage gain transfer function $H_{PA}(s)$, and the voltage distortion filter $H_{IV}(s)$.

In an embodiment, the transceiver circuit 42 includes a frequency equalizer 60. The frequency equalizer 60 is configured to apply a frequency equalization filter $H_F(s)$ to the time-variant modulation vector $\vec{b}_{MOD}$ to generate an equalized time-variant modulation vector $\vec{b}_{MOD-E}$. In a non-limiting example, the frequency equalization filter $H_F(s)$ can be described by equation (Eq. 3) below.

$$H_F(s)=[1/H_{ET}(s)]*[1/H_{RF}(s)] \qquad \text{(Eq. 3)}$$

In the equation (Eq. 3), $H_{RF}(s)$ represents a transfer function of the RF front-end circuit 50, which can be expressed as a ratio between $V_{OUT1}$ and $V_{OUT}$. In this embodiment, the equalizer circuit 58 is configured to receive the equalized time-variant modulation vector $\vec{b}_{MOD-E}$ as the selected form of the time-variant modulation vector $\vec{b}_{MOD}$ and apply the equalization filter $H_{EQ}(s)$ to the equalized time-variant modulation vector $\vec{b}_{MOD-E}$ to thereby generate a filtered time-variant modulation vector $\vec{b}_{MOD-F}$.

The target voltage circuit 54 is further configured to include a vector-to-real (V2R) converter 62 that is coupled to the equalizer circuit 58. The V2R converter 62 is configured to extract a selected real parameter $X_R$ from the filtered time-variant modulation vector $\vec{b}_{MOD-F}$. In a non-limiting example, the selected real parameter $X_R$ can be a real parameter representing the output voltage $V_{OUT}$, the input power $P_{IN}$, or the output power $P_{OUT}$.

The target voltage circuit 54 can also include a scaler 64 coupled to the V2R converter 60. The scaler 64 can be configured to scale the selected real parameter $X_R$ based on a scaling factor 66 to generate a scaled real parameter $X_{RS}$. In an embodiment, the scaling factor 66 can be determined according to an average power (e.g., root-mean-square average) of the RF signal 40. In a non-limiting example, the scaling factor 66 can be adapted between different timeslots or mini timeslots.

The target voltage circuit 54 also includes an ET LUT circuit 68. The ET LUT circuit 68 includes a single LUT (not shown) predetermined according to the selected frequency of the RF signal 40 to correlate the modulated target voltage $V_{TGT}$ with various type of input parameters. In one example, the LUT can be configured to correlate the modulated target voltage $V_{TGT}$ with the selected real parameter $X_R$ that represents the output voltage $V_{OUT}$. In this regard, if the selected real parameter $X_R$ extracted by the V2R converter

62 indeed represents the output voltage $V_{OUT}$, the ET LUT circuit 68 can simply look up the LUT based on the selected real parameter $X_R$ or the scaled real parameter $X_{RS}$ to generate the modulated target voltage $V_{TGT}$.

In case the selected real parameter $X_R$ extracted by the V2R converter 62 represents something different from the output voltage $V_{OUT}$ (e.g., the other output voltage $V_{OUT1}$), the target voltage circuit 54 may further include a unit converter 70 to convert the selected real parameter $X_R$ to a predefined parameter configured in LUT. Accordingly, the ET LUT circuit 68 can generate the modulated target voltage $V_{TGT}$ from the LUT based on the converted real parameter $X_R$.

As mentioned earlier, the LUT in the ET LUT circuit 68 may be predetermined based on the selected frequency of the RF signal 40. As the voltage distortion filter $H_{IV}(s)$ causes the frequency response of the output voltage $V_{OUT}$ to change, it is equivalent to moving the output voltage $V_{OUT}$ away from the selected frequency to a different frequency. In this regard, extracting the selected real parameter $X_R$ from the filtered time-variant modulation vector $\vec{b}_{MOD-F}$ is equivalent to moving the LUT along with the frequency change of the output voltage $V_{OUT}$. As a result, the modulated target voltage $V_{TGT}$ generated based on the LUT can compensate for the frequency shift of the output voltage $V_{OUT}$.

The signal processing circuit 52 may further include a memory digital predistortion (mDPD) circuit 72, which is coupled between the frequency equalizer 60 and the modulator circuit 56. The mDPD circuit 72 can be configured to digitally pre-distort the equalized time-variant modulation vector $\vec{b}_{MOD-E}$ to generate a pre-distorted time-variant modulation vector $\vec{b}_{MOD-DPD}$. Accordingly, the modulator circuit 56 is configured to generate the RF signal 40 from the pre-distorted time-variant modulation vector $\vec{b}_{MOD-DPD}$ and provide the RF signal 40 to the power amplifier circuit. 44.

FIG. 4 is a schematic diagram of an exemplary transmission circuit 74 configured according to another embodiment of the present disclosure to compensate for the unwanted voltage distortion filter $H_{IV}(s)$ in the existing transmission circuit 10 of FIG. 1A. Common elements between FIGS. 3 and 4 are shown therein with common element numbers and will not be re-described herein.

The transmission circuit 74 includes a transceiver circuit 76 that includes a first frequency equalizer circuit 78 and a second frequency equalizer circuit 80. The first frequency equalizer circuit 78 is configured to apply a first frequency equalization filter $H_{F1}(s)$ to the time-variant modulation vector $\vec{b}_{MOD}$ to generate a first equalized time-variant modulation vector $\vec{b}_{MOD-E1}$. The second frequency equalizer circuit 80 is configured to apply a second frequency equalization filter $H_{F2}(s)$ to the first equalized time-variant modulation vector $\vec{b}_{MOD-E1}$ to generate a second equalized time-variant modulation vector $\vec{b}_{MOD-E2}$. The first frequency equalization filter $H_{F1}(s)$ and the second frequency equalization filter $H_{F2}(s)$ can be expressed in equation (Eq. 4) below.

$$H_{F1}(s)=1/H_{RF}(s); H_{F2}(s)=1/H_{ET}(s) \qquad (Eq.\ 4)$$

In this embodiment, the equalizer circuit 58 is configured to apply the equalization filter $H_{EQ}(s)$ to the first equalized time-variant modulation vector $\vec{b}_{MOD-E1}$. The equalization filter $H_{EQ}(s)$ is equal to 1.

Herein, the mDPD circuit 72 is configured to digitally pre-distort the second equalized time-variant modulation vector $\vec{b}_{MOD-E2}$ to generate the pre-distorted time-variant modulation vector $\vec{b}_{MOD-DPD}$. Accordingly, the modulator circuit 56 is configured to generate the RF signal 40 from the pre-distorted time-variant modulation vector $\vec{b}_{MOD-DPD}$ and provide the RF signal 40 to the power amplifier circuit 44.

FIG. 5 is a graphic diagram providing an exemplary illustration of a modulation bandwidth 82 in which the transmission circuit 38 of FIG. 3 and the transmission circuit 74 of FIG. 4 can be configured to compensate for the unwanted voltage distortion filter in the existing transmission circuit of FIG. 1A. Elements in FIGS. 3 and 4 are referenced in conjunction with FIG. 5 and will not be redescribed herein.

In this example, the modulation bandwidth 82 is bound by a lower frequency 84 and an upper frequency 86. The LUT in the ET LUT circuit 68 in FIGS. 3 and 4 is initially determined based on a selected frequency 88 that falls between the lower frequency 84 and the upper frequency 86. In this regard, the selected real parameter $X_R$ extracted from the filtered time-variant modulation vector $\vec{b}_{MOD-F}$ is equivalent to moving the LUT from the selected frequency 88 to any other frequency within the modulation bandwidth 82.

Those skilled in the art will recognize improvements and modifications to the preferred embodiments of the present disclosure. All such improvements and modifications are considered within the scope of the concepts disclosed herein and the claims that follow.

What is claimed is:

1. A transmission circuit comprising:
    a power amplifier circuit coupled to a transmitter circuit via a radio frequency (RF) front-end circuit and configured to amplify an RF signal based on a modulated voltage and provide the amplified RF signal to the RF front-end circuit;
    an envelope tracking (ET) integrated circuit (ETIC) configured to generate the modulated voltage based on a modulated target voltage; and
    a transceiver circuit comprising:
        a signal processing circuit configured to generate the RF signal from a time-variant modulation vector; and
        a target voltage circuit comprising:
            an ET lookup table (LUT) circuit configured according to a selected frequency of the RF signal to generate the modulated target voltage as a function of the time-variant modulation vector; and
            an equalizer circuit configured to apply an equalization filter to a selected form of the time-variant modulation vector to compensate for a complex nonlinear voltage distortion filter created on an output stage of the power amplifier circuit by coupling the power amplifier circuit with the RF front-end circuit across a modulation bandwidth comprising the selected frequency.

2. The transmission circuit of claim 1, wherein the transceiver circuit further comprises a frequency equalizer configured to apply a frequency equalization filter to the time-variant modulation vector to generate an equalized time-variant modulation vector.

3. The transmission circuit of claim 2, wherein the equalizer circuit is further configured to apply the equalization filter to the equalized time-variant modulation vector to generate a filtered time-variant modulation vector.

4. The transmission circuit of claim 3, wherein the target voltage circuit further comprises a vector-to-real (V2R)

converter coupled to the equalizer circuit and configured to extract a selected real parameter from the filtered time-variant modulation vector.

5. The transmission circuit of claim 4, wherein the target voltage circuit further comprises a scaler coupled to the V2R converter and configured to scale the selected real parameter based on a scaling factor that is adapted according to an average power of the RF signal.

6. The transmission circuit of claim 4, wherein the target voltage circuit further comprises a unit converter configured to convert the selected real parameter to a predefined parameter configured in the ET LUT circuit for generating the modulated target voltage.

7. The transmission circuit of claim 2, wherein the equalization filter is expressed as: $H_{EQ}(s)=H_{ET}(s)$, wherein:
   $H_{EQ}(s)$ represents the equalization filter; and
   $H_{ET}(s)$ represents a combined complex filter configured to match a combined signal path filter, the combined complex filter is expressed as: $H_{ET}(s)=H_{IQ}(s)*H_{PA}(s)*H_{IV}(s)$, wherein:
   $H_{IQ}(s)$ represents a transfer function of the signal processing circuit;
   $H_{PA}(s)$ represents a voltage gain transfer function of the power amplifier circuit; and
   $H_{IV}(s)$ represents the complex nonlinear voltage distortion filter created on the output stage of the power amplifier circuit by coupling the power amplifier circuit with the RF front-end circuit.

8. The transmission circuit of claim 7, wherein the frequency equalization filter is expressed as $H_F(s)=[1/H_{ET}(s)]*[1/H_{RF}(s)]$, wherein:
   $H_F(s)$ represents the frequency equalization filter; and
   $H_{RF}(s)$ represents a transfer function of the RF front-end circuit.

9. The transmission circuit of claim 2, wherein the signal processing circuit comprises:
   a memory digital predistortion (mDPD) circuit configured to digitally pre-distort the equalized time-variant modulation vector to generate a pre-distorted time-variant modulation vector; and
   a modulator circuit configured to generate the RF signal from the pre-distorted time-variant modulation vector and provide the RF signal to the power amplifier circuit.

10. The transmission circuit of claim 1, wherein the transceiver circuit further comprises:
    a first frequency equalizer circuit configured to apply a first frequency equalization filter to the time-variant modulation vector to generate a first equalized time-variant modulation vector; and
    a second frequency equalizer circuit configured to apply a second frequency equalization filter to the first equalized time-variant modulation vector to generate a second equalized time-variant modulation vector.

11. The transmission circuit of claim 10, wherein the equalizer circuit is further configured to apply the equalization filter to the first equalized time-variant modulation vector to generate a filtered time-variant modulation vector.

12. The transmission circuit of claim 11, wherein the equalization filter is expressed as: $H_{EQ}(s)=1$, wherein $H_{EQ}(s)$ represents the equalization filter.

13. The transmission circuit of claim 11, wherein the target voltage circuit further comprises a vector-to-real (V2R) converter coupled to the equalizer circuit and configured to extract a selected real parameter from the filtered time-variant modulation vector.

14. The transmission circuit of claim 13, wherein the target voltage circuit further comprises a scaler coupled to the V2R converter and configured to scale the selected real parameter based on a scaling factor that is adapted according to an average power of the RF signal.

15. The transmission circuit of claim 13, wherein the target voltage circuit further comprises a unit converter configured to convert the selected real parameter to a predefined parameter configured in the ET LUT circuit for generating the modulated target voltage.

16. The transmission circuit of claim 10, wherein:
    the first frequency equalization filter is expressed as $H_{F1}(s)=1/H_{RF}(s)$, wherein:
    $H_{F1}(s)$ represents the first frequency equalization filter; and
    $H_{RF}(s)$ represents a transfer function of the RF front-end circuit; and
    the second frequency equalization filter is expressed as $H_{F2}(s)=1/H_{ET}(s)$, wherein:
    $H_{F2}(s)$ represents the second frequency equalization filter; and
    $H_{ET}(s)$ represents a combined complex filter configured to match a combined signal path filter, the combined complex filter is expressed as: $H_{ET}(s)=H_{IQ}(s)*H_{PA}(s)*H_{IV}(s)$, wherein:
    $H_{IQ}(s)$ represents a transfer function of the signal processing circuit;
    $H_{PA}(s)$ represents a voltage gain transfer function of the power amplifier circuit; and
    $H_{IV}(s)$ represents the complex nonlinear voltage distortion filter created on the output stage of the power amplifier circuit by coupling the power amplifier circuit with the RF front-end circuit.

17. The transmission circuit of claim 16, wherein the signal processing circuit comprises:
    a memory digital predistortion (mDPD) circuit configured to digitally pre-distort the second equalized time-variant modulation vector to generate a pre-distorted time-variant modulation vector; and
    a modulator circuit configured to generate the RF signal from the pre-distorted time-variant modulation vector and provide the RF signal to the power amplifier circuit.

* * * * *